US010102920B2

United States Patent
Reusswig et al.

(10) Patent No.: US 10,102,920 B2
(45) Date of Patent: Oct. 16, 2018

(54) MEMORY SYSTEM WITH A WEIGHTED READ RETRY TABLE

(71) Applicant: SanDisk Technologies LLC, Plano, TX (US)

(72) Inventors: Philip Reusswig, Mountain View, CA (US); Deepak Raghu, San Jose, CA (US); Zelei Guo, San Jose, CA (US); Chris Nga Yee Yip, Sunnyvale, CA (US)

(73) Assignee: SanDisk Technologies LLC, Plano, TX (US)

( * ) Notice: Subject to any disclaimer, the term of this patent is extended or adjusted under 35 U.S.C. 154(b) by 22 days.

(21) Appl. No.: 15/237,196

(22) Filed: Aug. 15, 2016

(65) Prior Publication Data

US 2018/0046527 A1    Feb. 15, 2018

(51) Int. Cl.

| | | |
|---|---|---|
| *G11C 29/02* | (2006.01) | |
| *G06F 11/07* | (2006.01) | |
| *G11C 29/50* | (2006.01) | |
| *G06F 11/14* | (2006.01) | |
| *G11C 11/56* | (2006.01) | |
| *G11C 16/26* | (2006.01) | |

(52) U.S. Cl.
CPC ......... *G11C 29/028* (2013.01); *G06F 11/076* (2013.01); *G06F 11/1435* (2013.01); *G11C 11/5642* (2013.01); *G11C 16/26* (2013.01); *G11C 29/021* (2013.01); *G11C 29/50004* (2013.01); *G11C 2029/5004* (2013.01)

(58) Field of Classification Search
CPC ............. G06F 11/1068; G06F 11/1076; G06F 11/1044; G06F 11/1072; G11C 29/52; G11C 16/26; G11C 16/14; G11C 29/021; G11C 29/028; G11C 29/42
See application file for complete search history.

(56) References Cited

U.S. PATENT DOCUMENTS

| | | |
|---|---|---|
| 8,514,646 B1 | 8/2013 | Nan |
| 9,799,405 B1 * | 10/2017 | Micheloni .............. G11C 16/26 |
| 2005/0122614 A1 | 6/2005 | Yun |
| 2013/0080858 A1 | 3/2013 | Lee et al. |
| 2013/0185612 A1 | 7/2013 | Lee et al. |
| 2014/0047269 A1 | 2/2014 | Kim |
| 2014/0075241 A1 | 3/2014 | Oh et al. |

(Continued)

OTHER PUBLICATIONS

Cai, Yu et al., "Threshold Voltage Distribution in MLC NAND Flash Memory: Characterization, Analysis, and Modeling," DSSC, Department of Electrical and Computer Engineering, Carnegie Mellon University, Pittsburgh, PA, 978-3-9815370-0-0/DATE13/ © 2013 EDAA (6 pp).

(Continued)

*Primary Examiner* — Shelly A Chase
(74) *Attorney, Agent, or Firm* — Brinks Gilson & Lione

(57) ABSTRACT

A storage device with a memory may utilize an optimized read retry operation. A read retry table includes a number of read retry cases with updated read thresholds. The read thresholds in the read retry table may be used to avoid errors caused by shifting of charge levels. The optimization of read retry includes weighting or reordering of the read retry cases in the read retry table. The selection of a read retry case (and corresponding read thresholds) are determined based on the weighting or reordering.

20 Claims, 9 Drawing Sheets

(56) References Cited

U.S. PATENT DOCUMENTS

| | | | | |
|---|---|---|---|---|
| 2014/0334228 A1* | 11/2014 | Kim | .................... | G06F 11/1072 |
| | | | | 365/185.03 |
| 2015/0039842 A1* | 2/2015 | Fitzpatrick | .............. | G06F 12/00 |
| | | | | 711/154 |
| 2015/0149871 A1* | 5/2015 | Chen | .................... | G06F 11/1068 |
| | | | | 714/773 |
| 2015/0370629 A1* | 12/2015 | Song | .................... | G11C 11/5642 |
| | | | | 714/721 |
| 2017/0168894 A1* | 6/2017 | Kim | .................... | G06F 11/1068 |

OTHER PUBLICATIONS

Cai, Yu et al, Threshold Voltage Distribution in MLC NAND Flash: Characterization, Analysis, and Modeling, PowerPoint Presentation, The Data Storage Systems Center, Electrical & Computer Engineering, Carnegie Mellon, Mar. 20, 2013 (23 pp.).

Hawes, Mark, "How Micron FortisFlash Technology Improves Performance and Endurance," *A Micron Technical Marketing Brief* (4 pp.).

* cited by examiner

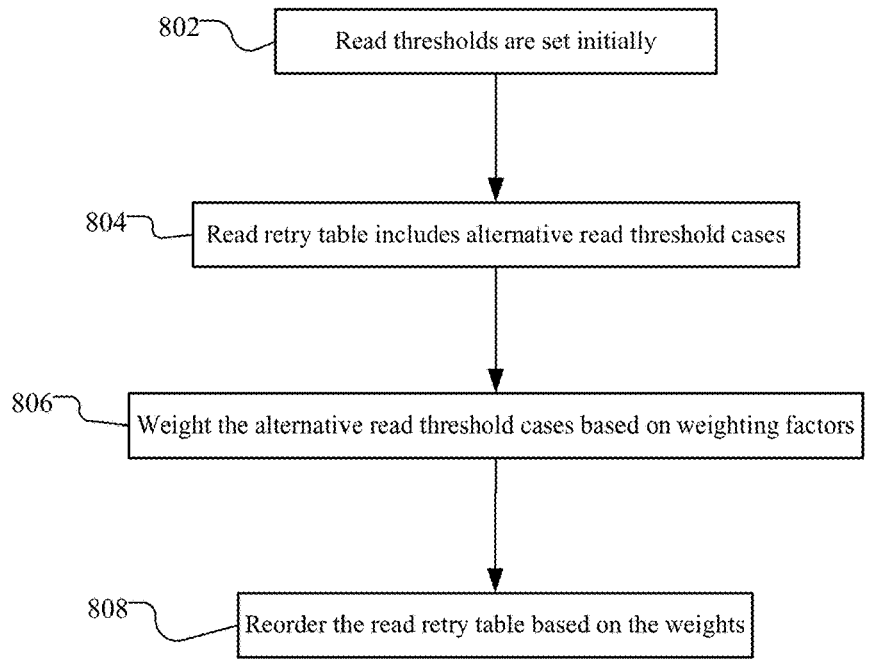
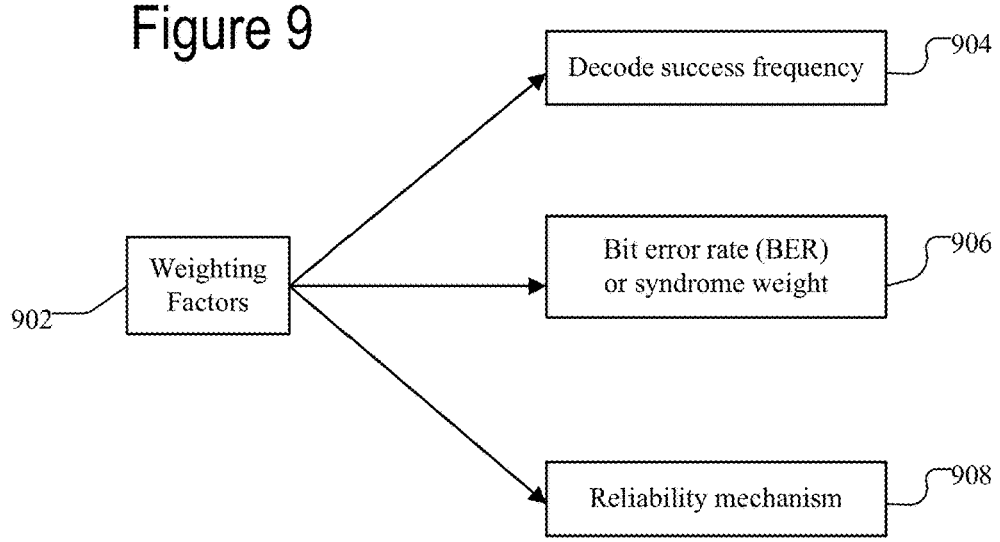

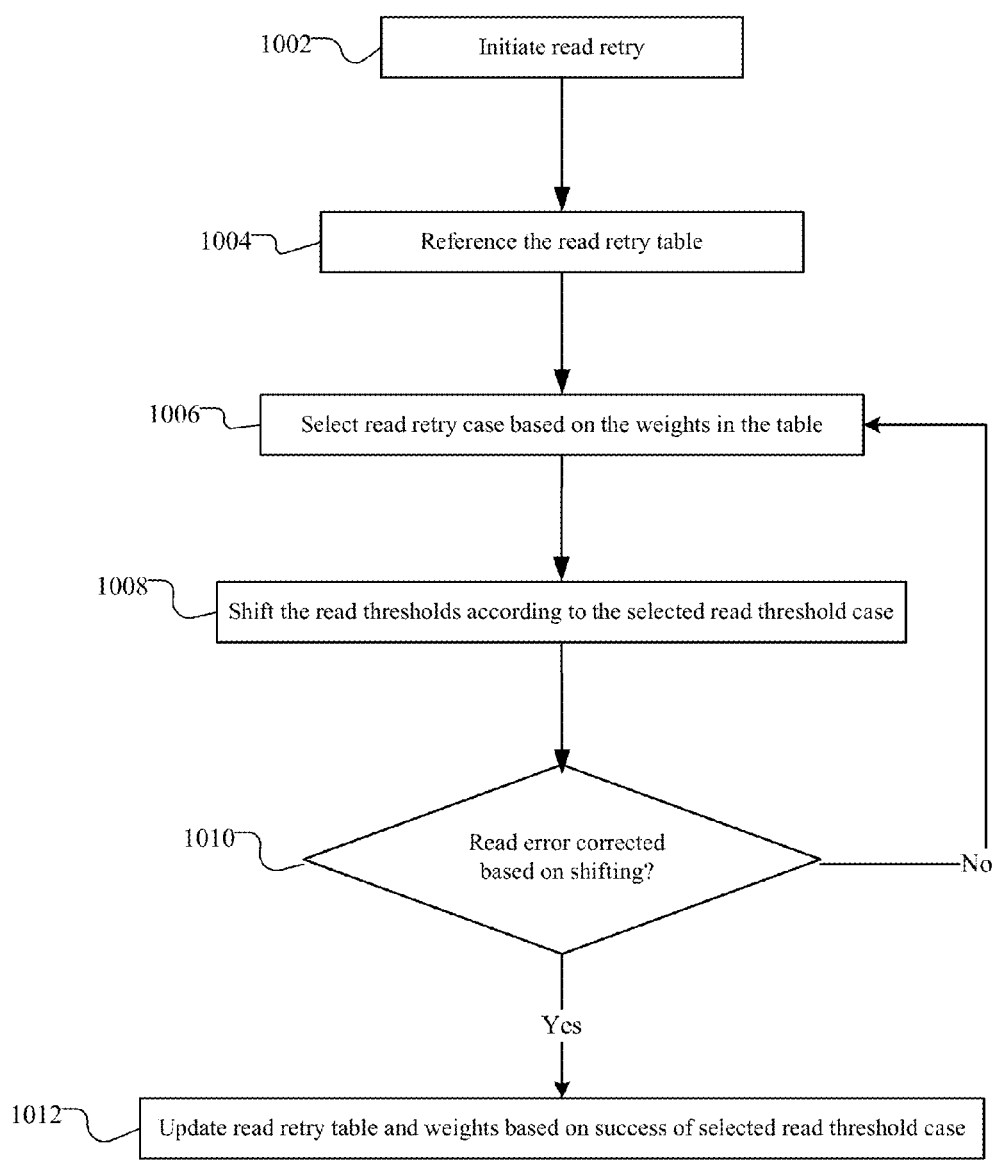

MEMORY SYSTEM WITH A WEIGHTED READ RETRY TABLE

TECHNICAL FIELD

This application relates generally to memory devices. More specifically, this application relates to improving read retry by optimizing a selection of a read retry case.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. NAND is one example of a non-volatile flash memory. Flash memory may have a limited endurance, which determines a number of times a particular memory can be erased and re-programmed. As the non-volatile memory cell scales to smaller dimensions with higher capacity per unit area, the cell endurance due to program and erase cycling, and disturbances (e.g. due to either read or program) may become more prominent. The overall vulnerability of memory cells and the defect level during the silicon process may become elevated as the cell dimension shrinks and process complexity increases, which directly affects the data integrity at both the memory and system. Likewise, time and temperature may hinder data retention (DR) in a memory device. Increased time and/or temperature may cause a device to wear more quickly and/or lose data (i.e. data retention loss). Errors, such as those caused by retention loss, must be corrected and the memory must attempt to prevent future errors. Read retry and adjustments of read thresholds may be one way to prevent errors.

BRIEF DESCRIPTION OF THE DRAWINGS

FIG. 8 is a process for optimizing a read retry table.

FIG. 9 is an example of read retry weighting factors.

FIG. 10 is a process for implementing an optimized read retry table.

DESCRIPTION OF THE EMBODIMENTS

Figure 1A:
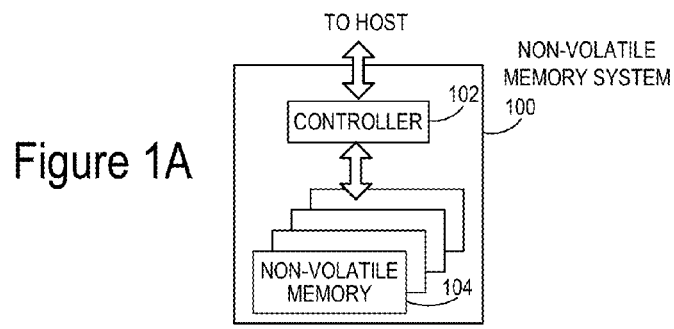
FIG. 1A is a block diagram of an example non-volatile memory system.

A storage device with a memory may utilize an optimized read retry operation. A read retry table includes a number of read retry cases with updated read thresholds. The read thresholds in the read retry table may be used to avoid errors caused by shifting of charge levels. The optimization of read retry includes weighting or reordering of the read retry cases in the read retry table. The selection of a read retry case (and corresponding read thresholds) are determined based on the weighting or reordering.

Read retry and adjustments of read thresholds may be one way to prevent errors, which may be caused by data retention problems or wear. Data retention errors may be due to the state overlaps or upper state shift, and may refer to either a gain or loss of charge over time. Data may be lost if the charge gain/loss passes over a threshold voltage which then changes the value of the cell. Data loss (i.e. poor data retention) results in a gradual shift of the distribution. Wear on the memory may cause the width and shape of the charge distributions to change.

Read retry precisely measures the threshold voltage of cells after programming. Read retry may allow a user to change the read reference voltage (i.e. read threshold or read threshold values) that separates the cell levels. After cycling, a memory cell has a higher rate of data or read threshold loss; therefore, more read margin is needed to read the different states after data retention—the more cycles, the more threshold loss. The read retry feature has different read threshold settings for each option that move the read state and enable the read algorithm to keep these states readable. When the read threshold values create errors, then read retry can be used to offer adjustments to those read threshold values. In one embodiment, read retry is initiated when an error bit number (i.e. bit error rate) is over capability of the ECC correction limit.

Read retry can be used to read out the threshold voltage of the programmed cells. In particular, read retry may include testing different read threshold voltages to identify an appropriate read threshold voltage in view of charge distribution changes. The different read retry voltage tests may be referred to as read retry cases, which are stored in a read retry table. Upon initiation of read retry, the memory may have to try several of the read retry cases from the read retry table until a read retry case is identified that includes read threshold voltages that correct the errors. The more read retry cases that are tested, the less efficient the memory may function. Accordingly, selecting an optimized read retry case more quickly improves memory efficiency and operation. As described below, an optimization of those read retry cases (and associated read thresholds) may utilize a weighting so that the read retry cases that are tried first are most likely to work.

Read recovery operations may include an iteratively applied read retry case that is executed with specific read threshold voltages for that case. If that case is not successful, then a different read retry case is applied. This process continues with read retry cases from the read retry table until a read error is corrected. Previously, the read retry table prioritized a most recent read retry case that was successful.

FIGS. 1A-2B are exemplary memory systems which may implement BDRL. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
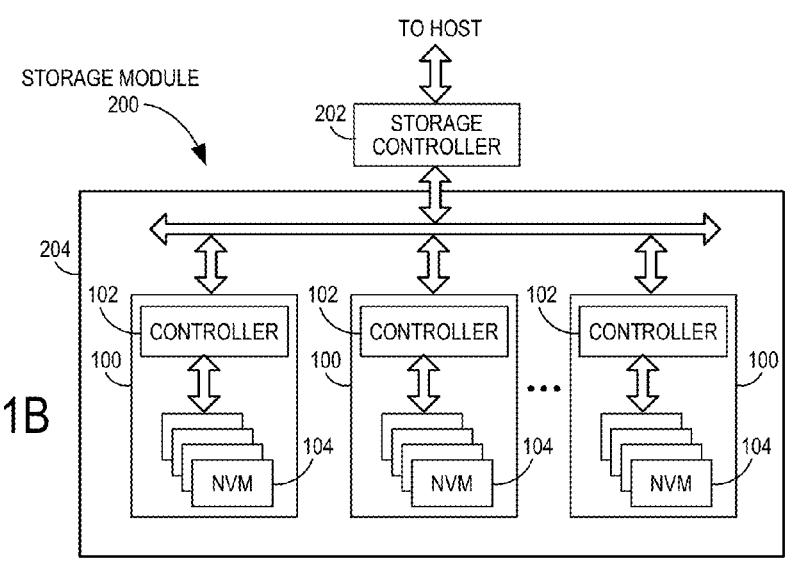
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
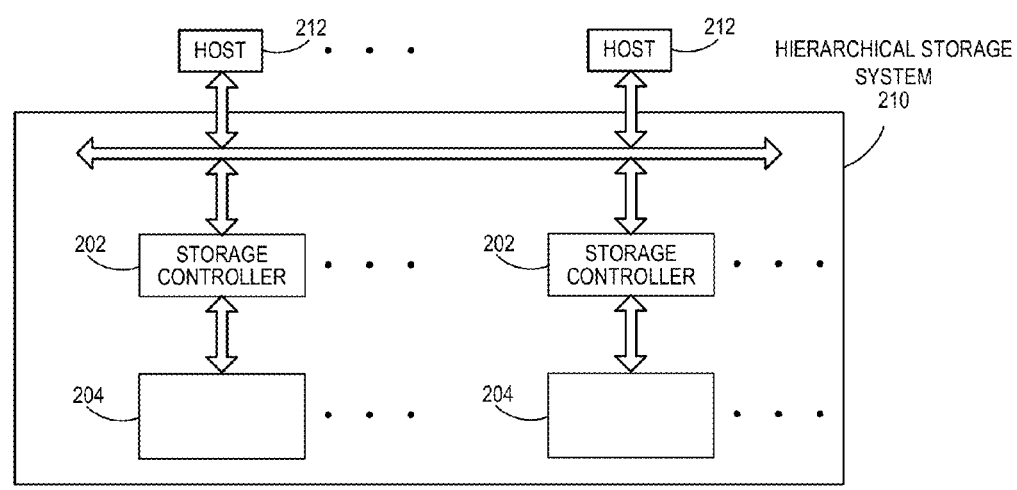
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
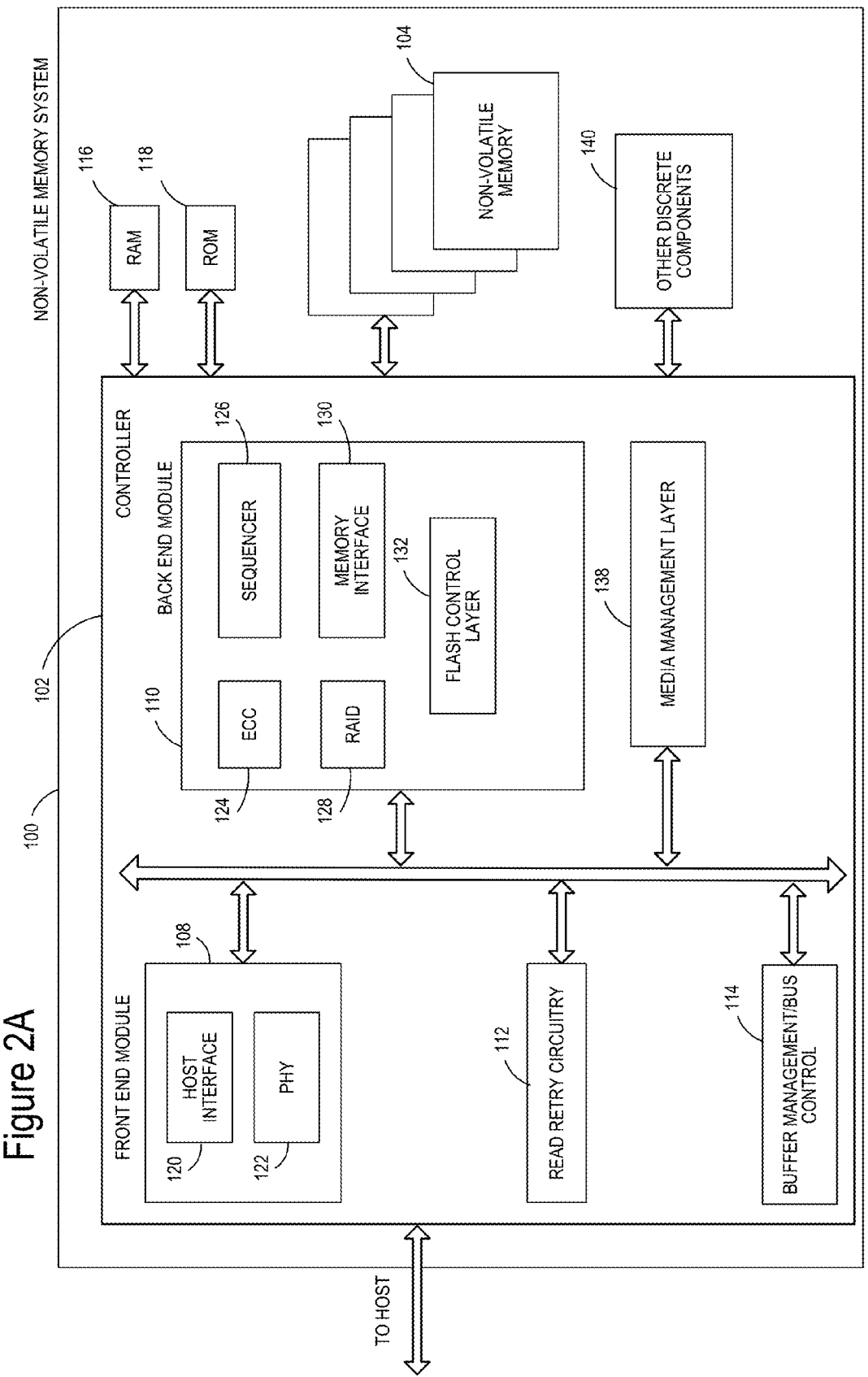
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

The controller 102 may include read retry circuitry 112. The read retry circuitry 112 may be used for performing optimized read retry. In addition, the read retry circuitry 112 may include a weighting value to each read retry case in a read retry table. The weighting may allow for a more efficient selection of a read retry case rather than just choosing the most recently used read retry case. The read retry circuitry 112 may generate the read retry table, including the weighting values for each of the read retry cases, as well as implementing the read retry process of selecting a read retry case and adjusting the read threshold voltages.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
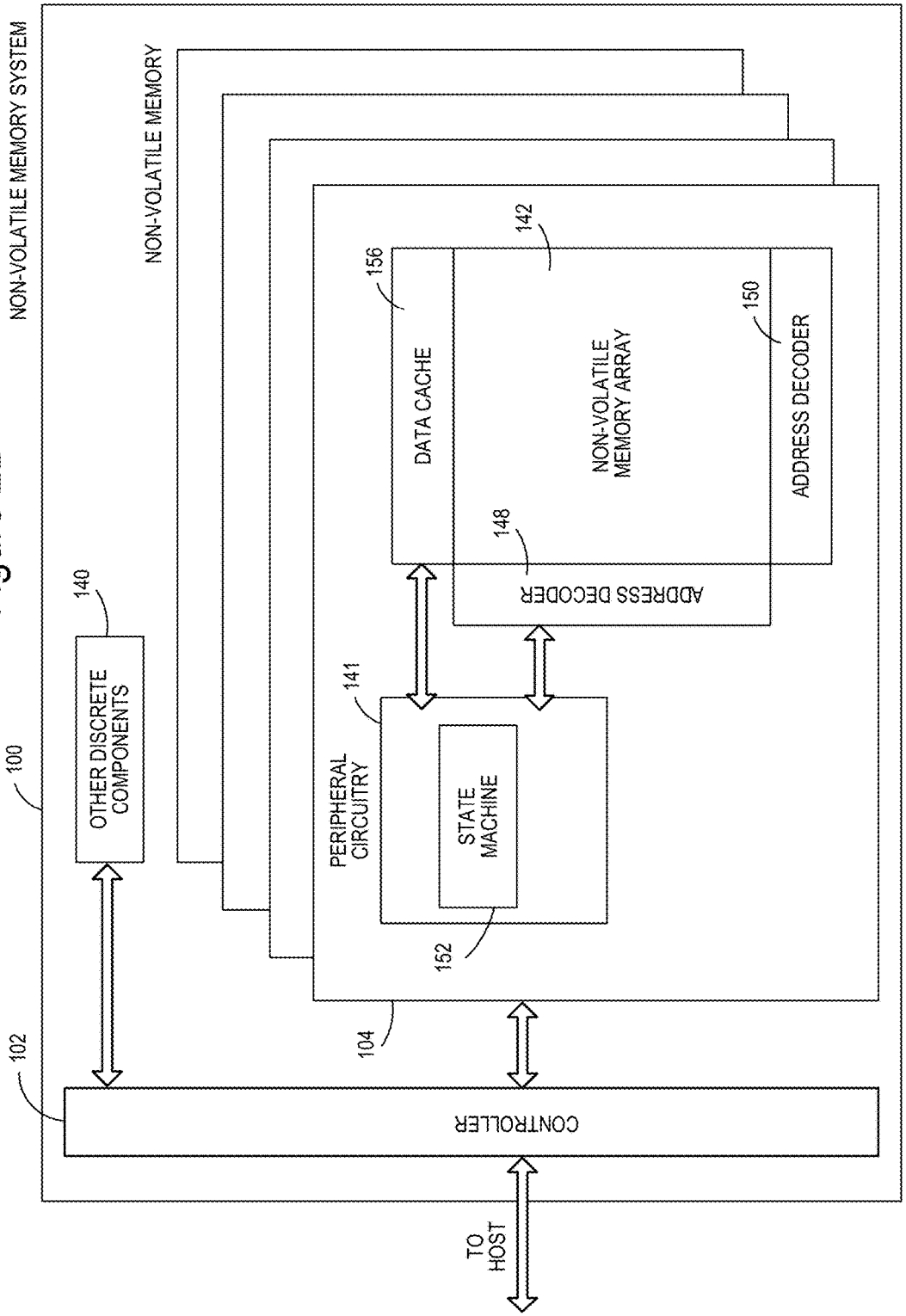
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. Exemplary peripheral circuitry 141 may include clocks, pumps, ESD, current shunt, current sink, and/or closely-packed logic circuits.

Figure 3:
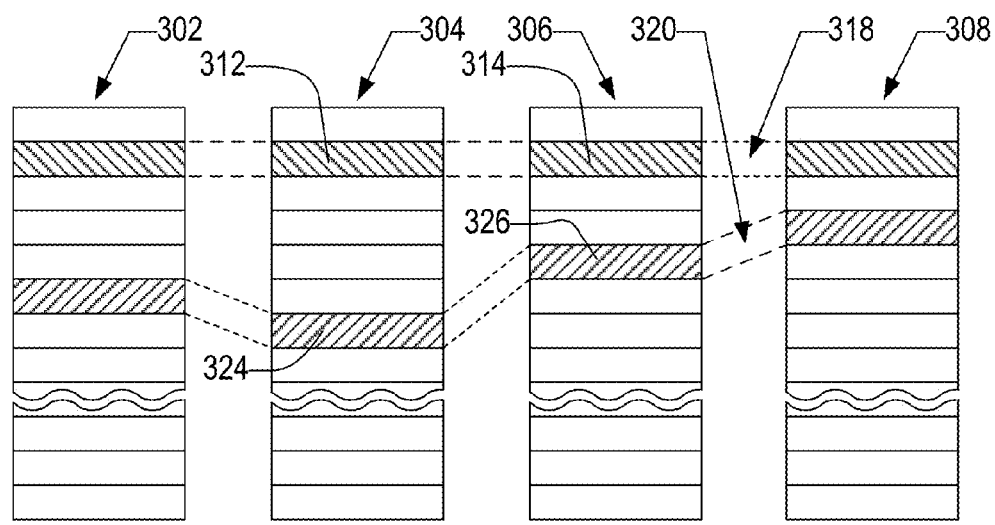
FIG. 3 is an example physical memory organization of the system of FIGS. 1A-2B.
Figure 4:
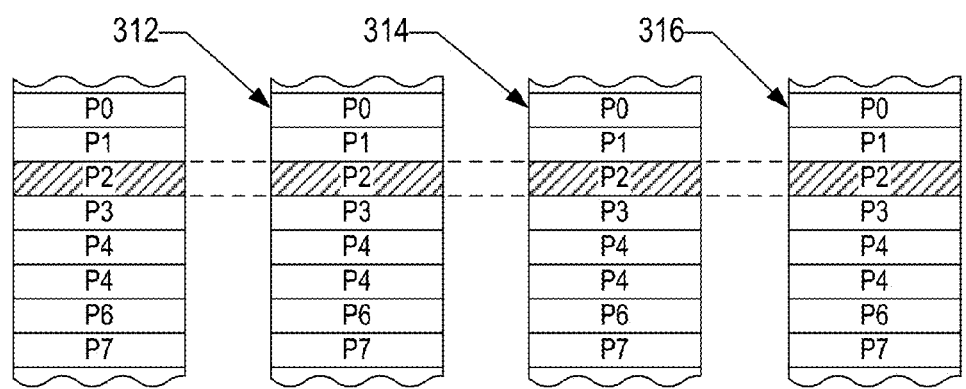
FIG. 4 is an expanded view of a portion of the physical memory of FIG. 3.

As described, the read retry mechanism may adjust read threshold levels as a result of error rates. The adjustment of read threshold voltages can be based on different levels of the memory (e.g. die, block, page, etc.). FIGS. 3-4 illustrate different groupings of memory that may be used for read retry (e.g. metablocks).

FIG. 3 conceptually illustrates an organization of the flash memory 104 (FIGS. 1A-2B) as a cell array. The flash memory 104 may include multiple memory cell arrays which are each separately controlled by a single or multiple memory controllers 102. Four planes or sub-arrays 302, 304, 306, and 308 of memory cells may be on a single integrated memory cell chip, on two chips (two of the planes on each chip) or on four separate chips. Although, reconditioning may be described at the block level (e.g. reconditioning the memory block-by-block), the reconditioning may be at a different level (e.g. page level or meta-block level).

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells described below may be a non-conductive dielectric charge trapping material.

Figure 5A:
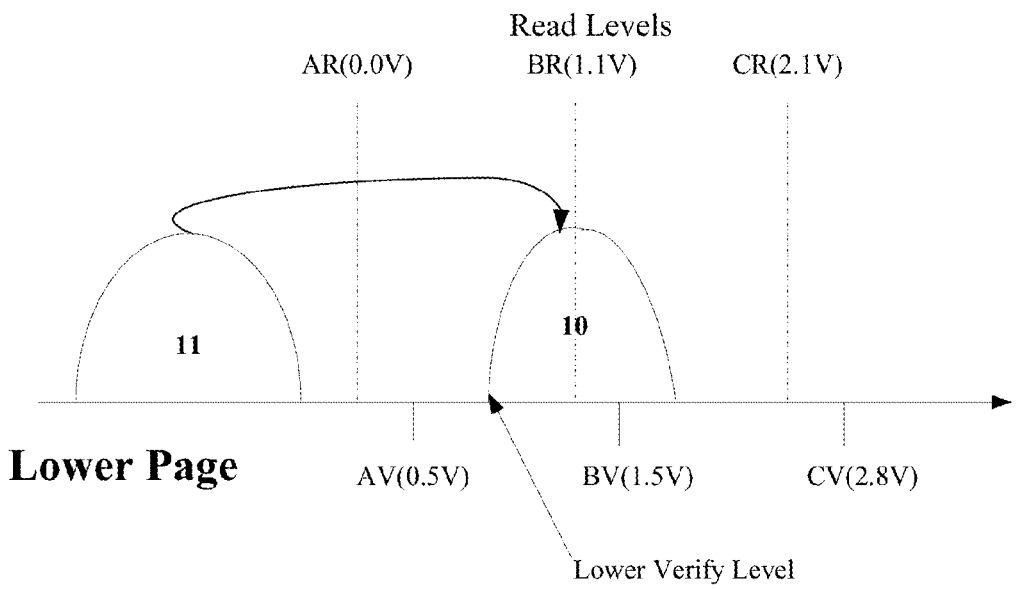
FIG. 5A is a diagram illustrating charge levels in a multi-level cell memory operated to store two bits of data in a memory cell.
Figure 5B:
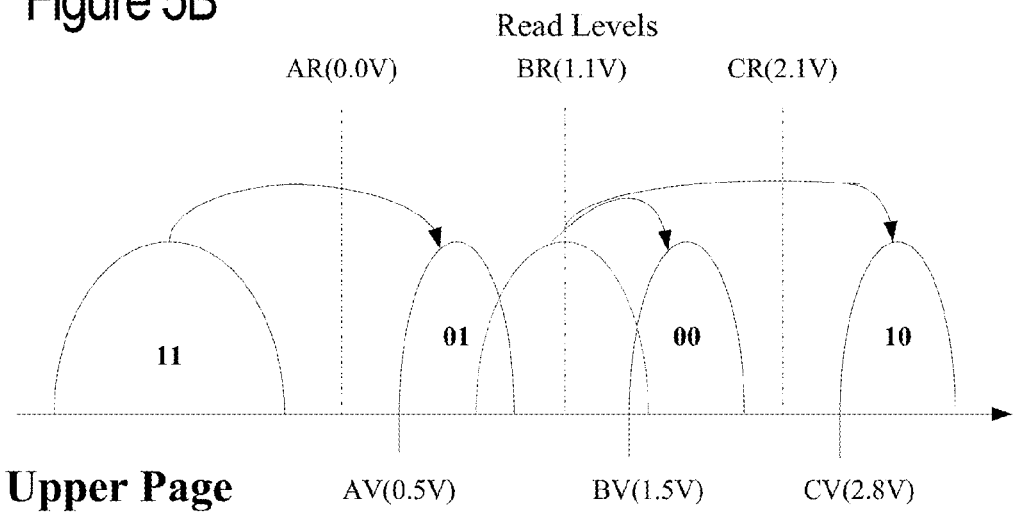
FIG. 5B is a diagram illustrating charge levels in a multi-level cell memory operated to store two bits of data in a memory cell.
Figure 6:
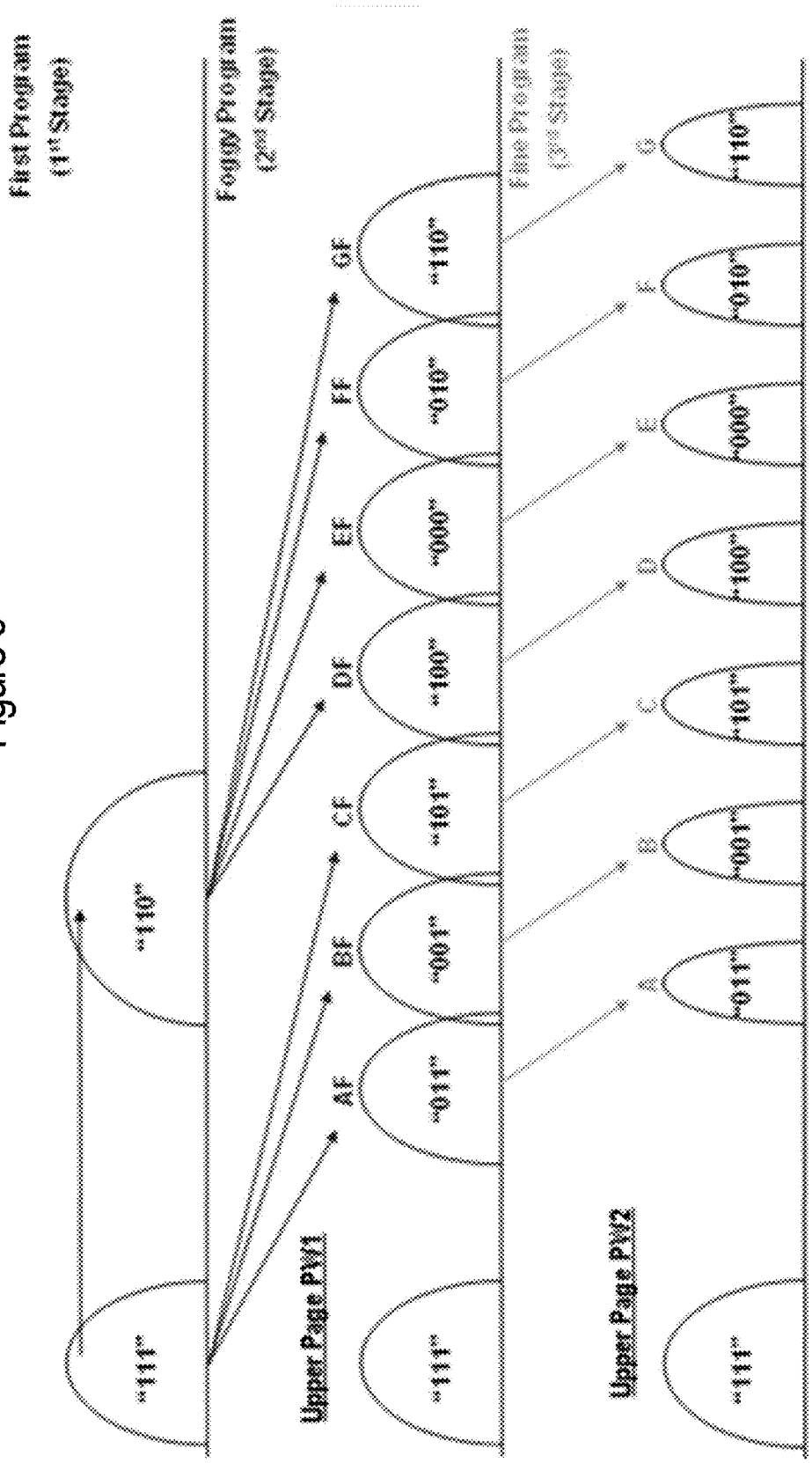
FIG. 6 is a diagram illustrating charge levels in a multi-level cell memory.

FIGS. 5A-5B are diagrams illustrating charge levels in cell memory. The charge storage elements of the memory cells are most commonly conductive floating gates but may alternatively be non-conductive dielectric charge trapping material. Each cell or memory unit may store a certain number of bits of data per cell. As shown in FIG. 5B, MLC memory may store four states and can retain two bits of data: 00 or 01 and 10 or 11. Alternatively, MLC memory may store eight states for retaining three bits of data as shown in FIG. 6. In other embodiments, there may be a different number of bits per cell.

FIG. 5B illustrates a memory cell that is operated to store two bits of data. This memory scheme may be referred to as eX2 memory because it has two bits per cell. The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. FIG. 5B illustrates a two-bit per cell memory scheme in which either four states (Erase, A, B, C) or with two states of SLC memory. This two-bit per cell memory (i.e. eX2) memory can operate as SLC or as four state MLC. Likewise, as described with respect to FIG. 6, three-bit per cell memory (i.e. eX3) can operate either as SLC or as eight state MLC. The NAND circuitry may be configured for only a certain number of bit per cell MLC memory, but still operate as SLC. In other words, MLC memory can operate as a MLC or SLC, but with regard to the MLC operation three bit per cell memory cannot operate as two bit per cell memory and vice-versa. The embodiments described below utilize any MLC memory scheme's ability to work with SLC to then operate at different bits per cell.

FIG. 5B illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The read margins are established for identifying each state. The three read margins (AR, BR, CR) delineate the four states. Likewise, there is a verify level (i.e. a voltage level) for establishing the lower bound for programming each state.

FIG. 5A may be referred to as lower at middle (LM) mode or lower-middle intermediate state. The LM intermediate state may also be referred to as a lower page programmed stage as shown in FIG. 5A. The lower page is programmed first in FIG. 5A and then the upper page is programmed in FIG. 5B. A value of "11" corresponds to an un-programmed state or erase state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 6 is a diagram illustrating charge levels in a multi-level cell memory operated to store three bits of data in a memory cell. FIG. 6 illustrates MLC memory with three bits of data which are stored in a single cell by establishing eight states or voltage level distinctions. FIG. 6 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 6 requires more exact programming voltages to avoid errors. Likewise, the read threshold voltages may be smaller and more likely to be susceptible to cell voltage or charge level movement, from electron movement or loss. In alternative embodiments, there may be memory schemes with increased bits per cell (e.g. 4 bits per cell or X4 memory).

Figure 7A:
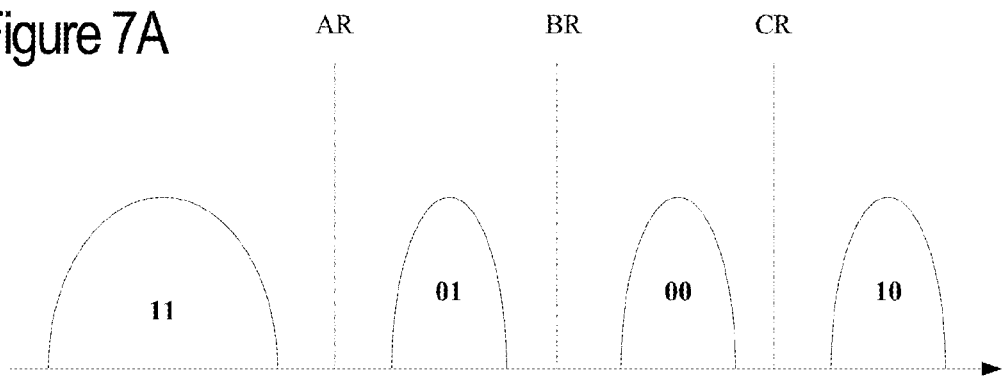
FIG. 7A illustrates the four charge levels used to represent two bits of data in a memory cell.
Figure 7B:
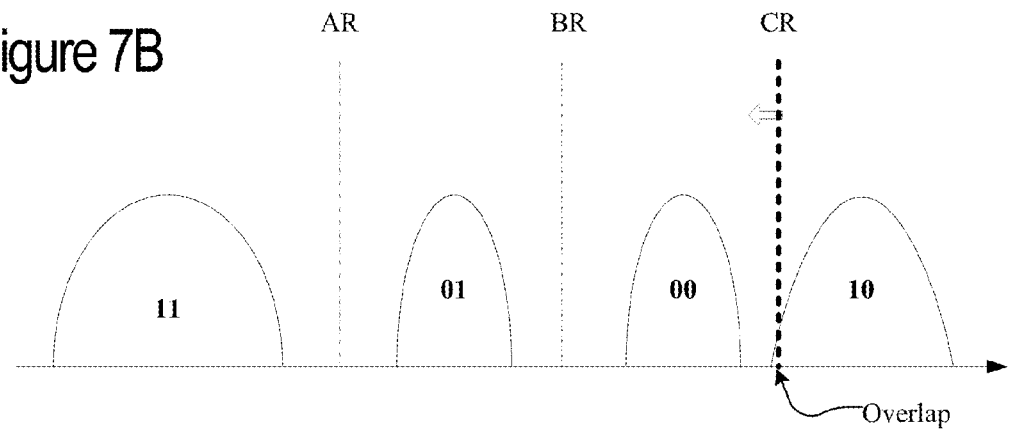
FIG. 7B illustrates a shifting charge distribution.
Figure 7C:
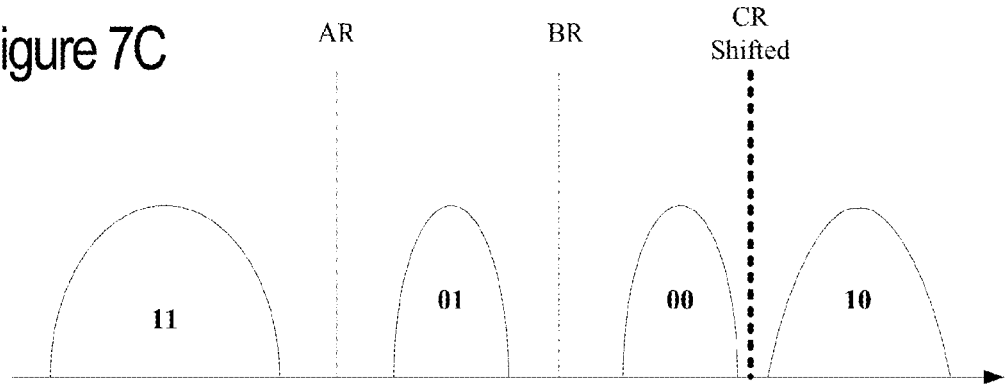
FIG. 7C illustrates adjustment of read levels as a result of charge level shifting.

Multi-level cell placements such as FIGS. 5A-5B or FIG. 6 can shift beyond the read threshold voltage, causing read errors. As long as the distributions are not overlapping, the data should be recoverable. FIGS. 7A-7C illustrate a shifting charge distribution that causes errors due to overlap with a read threshold value. In either the two bit memory system of FIGS. 5A-5B or the three bit memory system of FIG. 6, the charge distributions may shift or change resulting in problems with the read threshold. Although FIGS. 7A-7C illustrate two bit memory, it applies to other memory types (e.g. three bit memory shown in FIG. 6).

FIGS. 7A, 7B, and 7C illustrate adjustment of read levels as a result of charge level shifting. FIG. 7A illustrates the four charge levels used to represent two bits of data in a memory cell, such as shown in FIG. 5B. This two bit MLC memory stores four levels of charge corresponding to values of 11, 01, 10, and 00. In one embodiment, the 11 state may be referred to as the erase state. While the 01, 00, and 10 states may be referred to as the A, B, and C states, respectively. FIG. 7A illustrates the read threshold voltage between each of the states (AR, BR, CR). The read voltage threshold may also be referred to as a sense voltage and is the voltage level that a read operation uses to distinguish between the states.

FIG. 7B illustrates a shifting charge distribution. Charge distributions can shift and distribution tails can enter the previously non-overlapping distribution margin regions, crossing the read threshold voltages. As a result, a cell that stored one logical value can be misread as storing a different logical value, which is described as a read error or bit error. FIG. 7B illustrates the 10 state (C state) shifting due widening and crossing the read threshold voltage CR, which would cause read errors. As a result of the widening of the C state, there may be voltages that should be in the C state that have crossed the read threshold voltage (CR) and would be read as being in the B state. This overlap of a charge distribution with the read threshold voltage causes an error.

Read retry allows the read threshold voltages to be adjusted along with changes in charge distributions. The read retry case which utilizes this shift is considered a successful or working read retry case. Each read retry case in a read retry table includes a set of read threshold voltages that may or may not correct an error, such as the one shown in FIG. 7B. A read retry operation can modify the read threshold voltage (CR) in FIG. 7B to avoid overlap. FIG. 7C illustrates adjustment of read levels as a result of charge level shifting. Read retry shifts the read threshold voltage CR to the left to prevent overlap with the 10 C state. FIG. 7C illustrates that the shifting of the CR read threshold voltage would properly delineate the B and C states.

FIG. 8 is a process for optimizing a read retry table. In block 802, the read threshold voltages are set. The initial read threshold voltages may be set at the factory. However, as the memory ages, the charge distributions may shift and the initial read threshold voltages may generate read errors (e.g. FIG. 7B). In block 804, the read retry table includes alternative read retry cases that can be used to adjust or shift the read threshold voltage to avoid read errors. Each read retry case includes changes to the read threshold voltages.

Table 1 illustrates two exemplary read retry tables. One table uses static ordering and the other table uses weighted ordering. The static ordering may be set based only on which cases were used most recently. The ordering may not be completely static, in that a read retry case can be moved to the top, but that is only because it was used recently. Conversely, the read retry cases may be ordered or reordered based on a weight. The weight for each read retry case may depend on weighting factors. FIG. 9, discussed below, illustrates exemplary weighting factors. In the example of Table 1, the weighting factor is the frequency that a particular read retry case is selected.

TABLE 1

Exemplary Read Retry Tables comparing static ordering and weighted ordering.

| Static Ordering | Read Retry Case Number | Frequency of Selection | Weighted Ordering | Read Retry Case Number | Frequency of Selection |
|---|---|---|---|---|---|
| 0 | 0 | 47819 | 0 | 0 | 47819 |
| 1 | 1 | 58 | 1 | 10 | 4437 |
| 2 | 2 | 89 | 2 | 6 | 2109 |
| 3 | 3 | 71 | 3 | 8 | 908 |
| 4 | 4 | 515 | 4 | 9 | 604 |
| 5 | 5 | 2 | 5 | 4 | 515 |
| 6 | 6 | 2109 | 6 | 2 | 89 |
| 7 | 7 | 59 | 7 | 3 | 71 |
| 8 | 8 | 908 | 8 | 7 | 59 |
| 9 | 9 | 604 | 9 | 1 | 58 |
| 10 | 10 | 4437 | 10 | 5 | 2 |

Referring back to FIG. 8, the block 806 establishes weights for the read threshold cases based on weighting factors. Weighting read retry cases in a read retry table results in a more likely selection of a successful read retry case. Rather than selecting read retry cases based on most recent success, the read retry table can be weighted or reordered as shown with the weighted ordering on the right side of Table 1.

FIG. 9 illustrates exemplary read retry weighting factors 902. In block 904, the decode success frequency is one example. As shown in Table 1, the decode success frequency may be referred to as the selection frequency and corresponds to how often a read retry case has been selected successfully. When a read retry case is selected, it is then tested to see if it is correct or successful and this successful selection may merely be referred to as selection as shown in Table 1. Rather than relying on a most recently successful read retry case, the read retry case that is the most frequently successful may be used. As an alternative to frequency of selection, another weighting factor 902 is the bit error rate (BER) or syndrome weight 906. The BER for each read retry case may be a determination as to which read retry cases should be preferred.

The reliability mechanism 908 may be another exemplary weighting factor 902. The reliability mechanism 908 may include the cause of the error, such as read disturb (RD), data retention (DR), temperature cross (X-TEMP), or other wear issues. Knowing the cause of the error can be used for identifying which of the read retry cases would be most efficient and most likely to be successful. Accordingly, read retry cases can be classified or organized based on the reliability mechanism 908 and if a particular read retry case is frequently successful, then that may be an indication of the reliability mechanism that the device is suffering from. In other words, the success of particular read retry cases can identify whether a memory is suffering from read disturb, data retention, cross temperature, or other wear issues. Table 2 illustrates the reliability mechanism 908 as an addition to both the static ordering read retry table and the weighted ordering read retry table.

is successful in block 1010, then the read retry table is updated based on the success in block 1012. In particular, for the selection frequency 904 weighting factor, the successful selection is used to update the weights and the weighted order in block 1012. In other words, the read retry table can be iteratively or dynamically updated based on whether or not selected read retry cases are successful.

Weighted read retry is an optimization to the performance read path in respect to read error recovery in memory based products with an improved read retry table. The read retry table is actively re-sorting the read retry table based on read error pass rate. The read retry table is a list of read threshold voltage shifts from the default read level. The read retry table is designed to cover various endurance timeframes, including beginning of life (BOL), middle of life (MOL), end of life (EOL), reliability characteristics (read disturb, data retention, temperature cross), wordline (WL) dependence, and others. Upon initiation, the read retry mechanism cycles through the read retry table to find the appropriate case for the reliability/endurance/other mechanism. This may result in an increased read latency at BOL, MOL, and EOL when the weighting is not used to optimize selection. The weighted order read retry table is ordered to match the probability of success by using the weight attached to a read retry case number to reorder the read retry table.

In an alternative embodiment, a rate of change of the read retry cases may be used. The rate of change may be used for monitoring which read retry cases weight is trending or

TABLE 2

Exemplary Read Retry Tables showing static ordering on the left side and weighted ordering on the right side with reliability mechanism included for both.

| Static Ordering | Read Retry Case | Reliability Mechanism | Selection Frequency | Weighted Ordering | Read Retry Case | Reliability Mechanism | Selection Frequency |
| --- | --- | --- | --- | --- | --- | --- | --- |
| 0 | 0 | NA | 97074 | 0 | 0 | NA | 38207 |
| 1 | 1 | RD | 18 | 6 | 6 | DR | 9158 |
| 2 | 2 | RD | 85 | 5 | 5 | DR | 6506 |
| 3 | 3 | RD | 52 | 4 | 4 | DR | 2608 |
| 4 | 4 | DR | 2085 | 9 | 9 | X-TEMP | 86 |
| 5 | 5 | DR | 1284 | 1 | 1 | RD | 85 |
| 6 | 6 | DR | 8177 | 7 | 7 | X-TEMP | 84 |
| 7 | 7 | X-TEMP | 41 | 3 | 3 | RD | 51 |
| 8 | 8 | X-TEMP | 42 | 2 | 2 | RD | 50 |
| 9 | 9 | X-TEMP | 57 | 8 | 8 | X-TEMP | 3 |

Referring back to FIG. 8, the block 808 may reorder the read retry table based on the weights. In other words, the order of the table is based on the weight. In the example of Table 1, the top retry reorder case is selected; however, in the case of weighted reordering, the top read retry case is determined based on the weight.

FIG. 10 is a process for implementing an optimized read retry table. In other words, the read retry operation utilizes a weighted ordering of the read retry table. In block 1002, the read retry operation is initiated. The read retry table is referenced in block 1004. From the read retry table, a read retry case is selected based on the weights or weighted ordering in block 1006. Based on the selected read retry case, the read threshold voltage is shifted in block 1008. In block 1010, it is determined whether the shifting was successful. If the selected read retry case is not successful (i.e. the read threshold shift does not correct the read error condition), then the next read retry case is selected from the read retry table in block 1006. If the selected read retry case changing the most. This rate of change can also influence the ordering or detection of the state of the memory.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:
1. A storage device comprising:
a read retry table comprising a plurality of read retry cases, wherein each read retry case comprises a set of read thresholds;
read retry circuitry configured to initiate a read retry operation comprising:
selecting one of the read retry cases from the read retry table based on a weight associated with each of the read retry cases, wherein the weight is based on one or more weighting factors;
shifting read thresholds according to the selected read retry case; and
updating the read retry table depending on whether the shifted read thresholds are correct.

2. The storage device of claim 1 wherein the weighting factors comprise a frequency of decode success, a bit error rate (BER), or a reliability mechanism.

3. The storage device of claim 2 wherein the frequency of decode success comprises a frequency that a particular read retry case and its shifted read thresholds correct an error.

4. The storage device of claim 1 further comprising:
a memory comprising memory blocks; and
a controller coupled with the memory that is configured to access the read retry circuitry and initiate the read retry operation.

5. The storage device of claim 1 wherein the updating the read retry table comprises reordering the read retry cases according to priority.

6. The storage device of claim 5 wherein the priority corresponds to the weight for each of the read retry cases.

7. The storage device of claim 1 wherein the read thresholds comprise a voltage at which charge distributions are distinguished.

8. The storage device of claim 7 wherein the read retry operation is initiated when detected errors exceed an error threshold.

9. The storage device of claim 8 wherein the detected errors result from the charge distributions shifting.

10. The storage device of claim 9 wherein the shifting of the read thresholds comprises shifting read thresholds based on the shifting of the charge distributions.

11. The storage device of claim 7 wherein each of the set of read thresholds comprises a read voltage level between each charge distribution.

12. A method for read retry comprising:
    referencing a read retry table comprising a plurality of read retry cases, wherein each read retry case comprises a set of read thresholds;
    including a weighted ordering for the read retry table;
    selecting, upon initiation of a read retry operation, one of the read retry cases from the read retry table based on the weighted ordering; and
    adjusting read thresholds according to read thresholds associated with the selected one of the read retry cases.

13. The method of claim 12 wherein the initiation of the read retry operation is based on an error rate.

14. The method of claim 13 wherein the error rate is caused by shifting charge distributions.

15. The method of claim 14 the shifting charge distributions cause an overlap with at least one of the read thresholds and the adjusting includes fixing the overlap.

16. The method of claim 15 wherein the fixing of the overlap comprises shifting the read threshold in an opposite direction of the shifting of the charge distribution.

17. The method of claim 12 wherein the weighted ordering is weighted based on a frequency of decode success, a bit error rate (BER), or a reliability mechanism.

18. The method of claim 17 wherein the frequency of decode success comprises a number of times a particular read retry case and its adjusted read thresholds correct an overlap of a read threshold with a shifted charge distribution.

19. A memory system comprising:
    means for receiving a read retry table comprising read retry cases;
    means for selecting one of the read retry cases from the read retry table based on one or more weighting factors associated with each of the read retry cases; and
    means for optimizing which of the read threshold shifts are performed based on the selected read retry case.

20. The system of claim 19 wherein the one or more weighting factors comprises a frequency of decode success, a bit error rate (BER), or a reliability mechanism.

* * * * *